United States Patent [19]

Friedlander et al.

[11] Patent Number: 4,479,199
[45] Date of Patent: Oct. 23, 1984

[54] INFORMATION STORAGE SYSTEM USING A PHOTON ECHO MEDIUM

[76] Inventors: Marc A. Friedlander, 20217 Darlington Dr., Gaithersburg, Md. 20760; Sheldon Z. Meth, 11104 Oak Leaf Dr., Silver Spring, Md. 20901

[21] Appl. No.: 246,175

[22] Filed: Mar. 23, 1981

[51] Int. Cl.³ .............................................. G11C 13/04
[52] U.S. Cl. ...................................... 365/119; 350/353
[58] Field of Search .......... 365/119; 350/353, DIG. 1

[56] References Cited

U.S. PATENT DOCUMENTS

| | | | |
|---|---|---|---|
| 3,452,332 | 6/1969 | Bron et al. | 365/119 |
| 3,508,208 | 4/1970 | Duquay et al. | 365/119 |
| 3,638,029 | 1/1972 | Hartmann et al. | 365/119 |
| 3,654,626 | 4/1972 | Geller et al. | 365/119 |
| 3,720,926 | 3/1973 | Schneider | 365/119 |
| 3,896,420 | 7/1975 | Szabo | 365/119 |
| 3,934,234 | 1/1976 | Burt | 365/119 |
| 4,333,165 | 6/1982 | Swainson et al. | 365/119 |

*Primary Examiner*—Stuart N. Hecker
*Attorney, Agent, or Firm*—Lahive & Cockfield

[57] ABSTRACT

An information storage system including a multiple cell echo medium and associated excitation, detection and addressing devices. The excitation, detection and addressing devices are operative in conjunction with the echo medium to selectively store and extract information from various cells in the echo medium utilizing resonance phenomena, such as photon echoes.

52 Claims, 9 Drawing Figures

AT TIME $T_a$:

AT TIME $T_2$:

AT TIME $T_3$:

AFTER TIME $T_3$

INFORMATION STORAGE SYSTEM USING A PHOTON ECHO MEDIUM

BACKGROUND OF THE INVENTION

The present invention is in the field of information processing systems, and more particularly is directed to information storage devices for such systems.

The development of information processing systems has resulted in the development of associated data storge, or memory, subsystems. As the complexity and size of modern data bases and computer systems has increased, there has generally been a correspondingly growing requirement for higher speed and increased capacity on-line mass memories.

The density of memory elements (or storage cells) in memory systems has become an increasingly significant factor in meeting these growing requirements. Representative devices which are currently used for high density, relatively fast, on-line mass memories are the CDC large disk (having 300K bits/in$^2$), the IBM 3850/B4 (having 328K bits/in$^2$), and the Ampex Terabit memory (having 450K bits/in$^2$). All of these systems provide read/write times on the order of 0.1 to 1.0 microseconds. In addition, semiconductor, CCD, magnetic bubble, video disk and Josephson junction memories are presently being developed to provide storage densities as high as 860 megabits per square inch, with read/write times as low as 10 picoseconds. Furthermore, electron beam addressable memories are presently being considered with design goal densities on the order of $10^{10}$–$10^{12}$ bits/in$^2$, with 10 nanosecond read/write times.

Although the existing prior art devices, as well as those presently being developed, do provide relatively compact, large capacity, high speed on-line memories, these characteristics are, of course, limited.

It is an object of the present invention to provide an improved compact, high speed mass memory.

SUMMARY OF THE INVENTION

Briefly, the present invention is a volumetric information storage system which permits storage and extraction of analog or digital data in a two or three dimensional array.

In one form of the invention, the system includes a photon echo medium. The echo medium has a plurality of cells, for example, in a two or three dimensional array, wherein each cell includes one or more molecules having at least one excited state and a ground state. As used herein, the term "molecule" is defined to include molecules having a single atom as well as those having multiple atoms. In molecules of each cell, the excited states are excitable by one or more incident photons characterized by one or more of a plurality of predetermined frequencies.

The system further includes a photon pulse generator which is selectively operable to generate pulses fo photons characterized by one or more of the predetermined frequencies. The pulse generator is coupled to the echo medium by way of an addressing device for selectively directing the generated photon pulses onto one or more of the molecules of selected cells in the medium. A detector is coupled to the echo medium for detecting photons emitted by one or more of the molecules of the selected cells.

The system further includes a controller for operating the photon pulse generator and addressing device to selectively store data in and extract data from the selected cells. The controller is adapted to control the photon pulse generator to generate a predetermined succesion of photon pulses for cells selected by the addressing device so that at least one molecule in that cell may first be excited, and then subsequently generate an echo comprising at least one emitted photon. In various forms of the invention, the successions of photon pulses produced by the generator have predetermined photon densities and widths, spectral content, and inter-pulse separations so that the molecules may generate various forms of echos. For example, for optical memory systems in accordance with the present invention, the echos may be in any one of the group consisting of photon, Raman, tri-level, multiple, multiphoton, stimulated photon, stimulated Raman, stimulated tri-level, stimulated multiple, and stimulated multiphoton. The invention may alternatively be adapted for operation in other spectral regions for electromagnetic radiation, such as X-ray regions or microwave regions. Alternatively, the invention may be configured for operation based on acoustic echo phenomena where the echos may be phonon echo phenomena. Generally, the invention may be adapted for any resonance phenomena, although the invention is discussed below only in terms of the exemplary optical form.

In this later form of the invention, storage densities may be achieved as high as $10^{15}$ memory elements per cubic centimeter, with a serial access rate as high as 10 gigabits per second. This compact, high speed, mass memory has relatively low power requirements. For example, on the order 50 watts of continuous optical refresh power is needed for a $10^{15}$ bit system, with the read/write energy being less than 160 nanojoules per bit.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Figure 1:
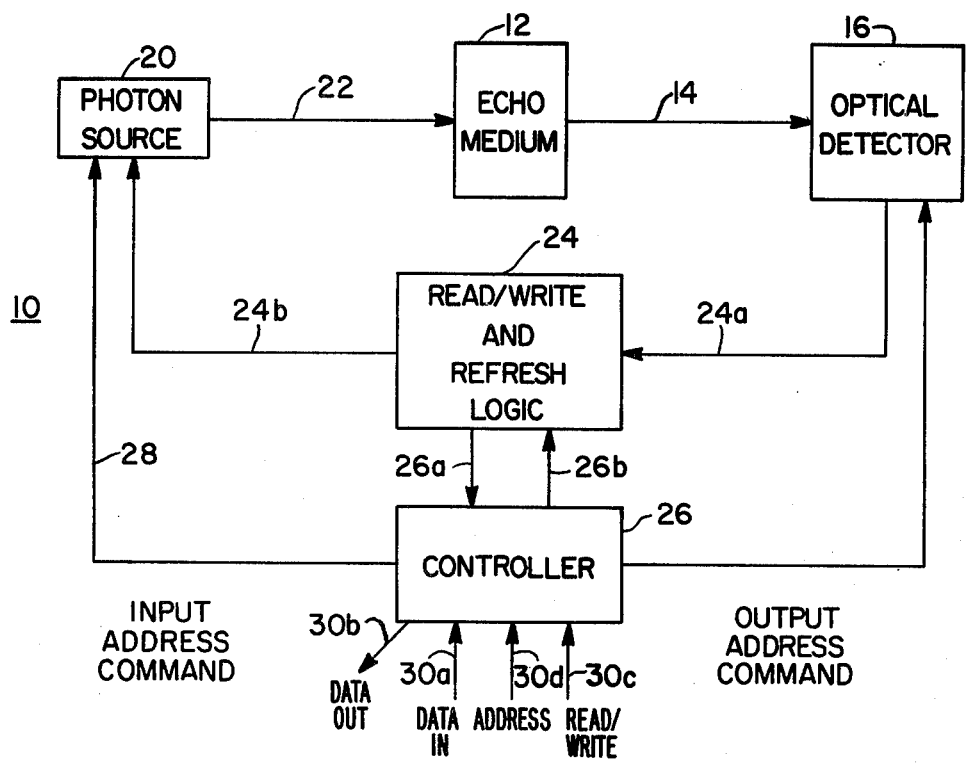
FIG. 1 shows, in block diagram form, an echo memory system in accordacne with the invention.

FIG. 1 shows an echo memory system 10 in accordance with the present invention. System 10 includes an echo medium 12 which includes an array (two or three dimensional) of cells, each cell including a plurality of single (or multiple) atom molecules having at least one excited state and a ground state. The echo medium 12 is optically coupled at its output to an optical detector network 16, which detects photons emitted from echo medium 12, as indicated by arrow 14. In the present embodiment, detector 16 includes a single detector element which is "steerable" to detect photons from the selected cells of medium 12. In alternate embodiments, there may be several detectors, each including a single detector element for a predetermined group of cells of medium 12.

Echo medium 12 is optically coupled at its input to a photon source 20 which selectively generates photon pulses and directs those pulses to echo medium 12, as indicated by arrow 22. In the present embodiment, source 20 includes a single photon source which is "steerable" so that output photons may be selectively directed upon the various cells of medium 12. In other embodiments, there may be several sources, each including a source element for a predetermined group of cells of medium 12. In the system 10, the photon source includes one or more lasers, (which emit beams of characteristic frequencies corresponding to the excitation frequencies of the molecules in the cells of the echo medium) and associated beam steering devices. In alternative embodiments, it is not necessary that the source 20 includes lasers since the invention does not depend on having coherent light. In yet other embodiments, such as acoustic forms of the invention, the source 20 may be a phonon source and the detector 16 may be a phonon detector.

The optical detector network 16 is coupled by way of line 24a to read/write and refresh logic 24, which in turn is coupled by way of line 24b to the photon source 20. A controller 26 controls the operation of read/write and refresh logic 24 by way of lines 26a and 26b, and controls the steering for source 20 and detector 16 by way of input and output address commands on lines 28 and 29, respectively. Data to be stored in medium 10 is applied to controller 26 by way of line 30a and data extracted from medium 10 is provided on line 30b. Read/write and address control signals are applied to controller 26 by way of lines 30c and 30d, respectively.

The controller 26 controls the photon source 20 to direct a succession of photon pulses onto one or more selected cells in medium 12. The succession of photon pulses have predetermined photon densities and widths, spectral content and inter-pulse separations to store data in the selected cells (when desired) and to extract data previously stored in those cells. Generally, the storage and extraction process requires the generator of a photon (or other form of) echo. By way of example, various optical forms of the invention may be adapted for, but not be limited to, the following echo types: photon, Raman, tri-level, multiple, multi-photon, stimulated photon, stimulated Raman, stimulated tri-level, stimulated multiple, stimulated multi-photon. The stored data may be binary form, where there either is or is not an echo produced by the extraction process for a cell. Alternatively, the data may be in analog form, where an echo is produced having some characteristic, such as intensity or delay time, which is related to the value of the data stored in a cell.

The operation of the embodiment of FIG. 1 will now be described in detail for a photon echo form of the invention. This description is in terms of a relatively simple "pseudo-dipole" model. Alternatively, the description may be expressed in terms of a rigorous quantum mechanical analysis, for example, utilizing known density matrix techniques to accommodate the statistical nature of the multi-body system.

In the present description, the echo medium 12 is a medium which is considered to have one or more regions which are herein denoted as memory elements, or cells, each capable of storing data in either binary or analog form. Each cell may be considered to include a plurality of molecules (which may be single, or multiple, atom molecules), each of which has a ground state and at least one excited state, excitable by an incident one or more photons characterized by one or more predetermined excitation frequencies. It will be understood that the term "ground state" includes a possibly degenerate ground state. Each of the molecules may be characterized by a "pseudo-dipole" moment which, when the molecule is in its ground state, it aligned in the direction of a first reference axis. When one of these molecules is in a linear superposition of its ground state and one of its excited states, it may be characterized by a pseudo-dipole moment, a component of which precesses in a plane perpendicular to the first reference axis. Furthermore, the pseudo-dipole moment for these molecules is rotatable about an axis parallel to a second reference axis (which is perpendicular to the first reference axis) in response to one or more incident photons characterized by one or more of the excitation frequencies.

In the simplest case, in response to two temporally separated (by T seconds) photon pulses at the appropriate excitation frequency applied by the photon source 20 to a cell of medium 12, the molecules in that cell spontaneously produce a burst of light (i.e. photons) at an interval T after the second pulse. This spontaneously produced burst of light is termed a photon echo.

In the presently described embodiment, the controller 26 provides an input address command signal to the photon source 20 by way of line 28. These signals control the direction of the beams provided by source 20. Generally, the controller 26 periodically causes photon source 20 to scan all the cells in the echo medium, to provide a cyclical refresh operation. During each memory refresh cycle, each cell undergoes a refresh operation. Generally, the cell contents are first read out and then the same information is restored under the control of controller 26 in conjunction with logic 24.

Independently of the cyclical refresh operation, information can be stored in or extracted from any of th cells at any time. The detailed operation of storing information in and extracting information from a cell will now be described in terms of the pseudo-dipole model in conjunction with FIGS. 2–7.

Figure 2:
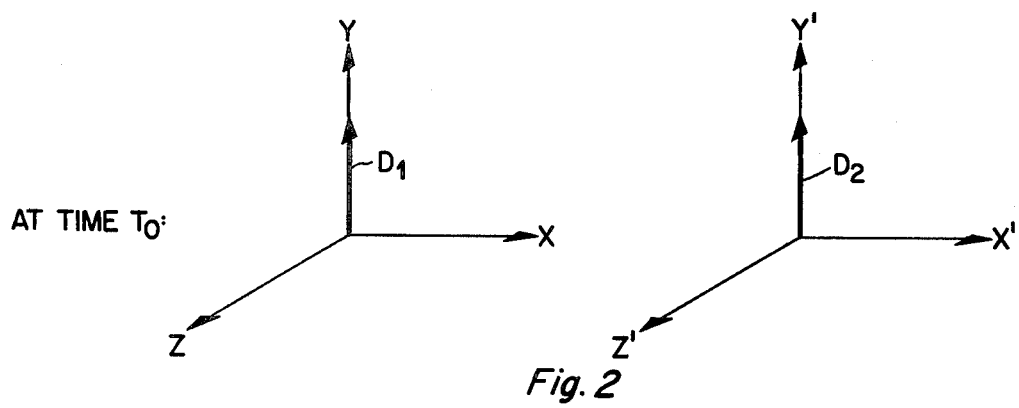
FIGS. 2–7 illustrate the operation of a cell in the system of FIG. 1.

FIG. 2 shows the pseudo-dipole moment $D_1$ and $D_2$ of two molecules in their ground states in a cell of the medium 12 at a time $t_0$ with respect to parallel X-Y-Z and X'-Y'-Z' coordinate systems. Initially, the pseudo-dipole moments $D_1$ and $D_2$ are aligned with the Y and Y' axes, respectively.

Figure 3:
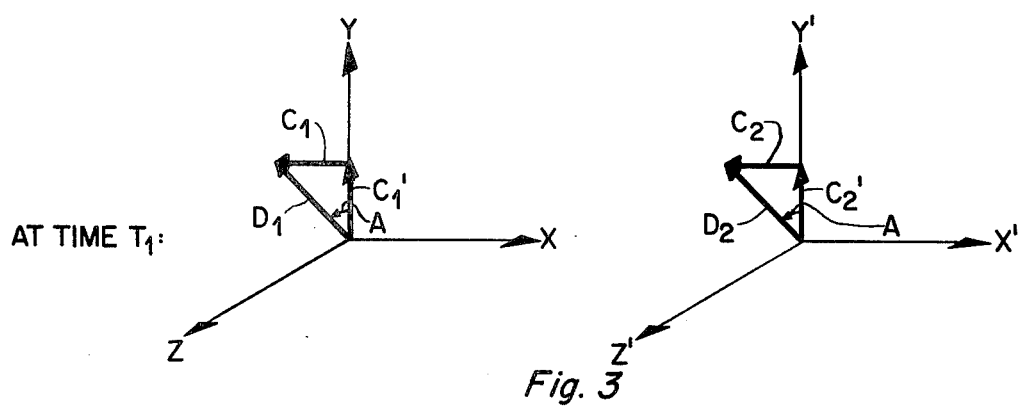

At a first time, the photon source 20 directs photons characterized by one or more of the excitation frequencies onto the ground state molecules in the cell. In response to these incident photons, the pseudo-dipole moments $D_1$ and $D_2$ of those irradiated dipoles are rotated by a first angle A about the Z and Z' axes, respectively, as shown in FIG. 3. Optimally, angle A is 90 degrees (modulo 180 degrees), i.e. $(90+n\cdot180)$ degrees, where n is an integer or zero, although other angles are permissible. In this orientation, the pseudo-dipole moments $D_1$ and $D_2$ include components $C_1$ and $C_2$ in the X-Y and X'-Y' planes, respectively, and components $C'_1$ and $C'_2$ along the Z and Z' axes, respectively. Following the excitation at time $t_1$, the pseudo-dipole moments $D_1$ and $D_2$ precess about the Y and Y' axes, respectively, with the result that components $C_1$ and $C_2$ may be considered to precess about those axes while the components $C'_1$ and $C'_2$ remain fixed.

Figure 4:
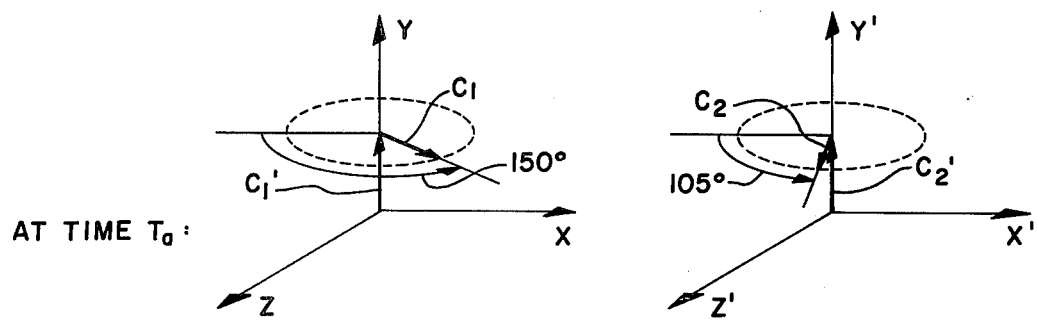
Figure 5:
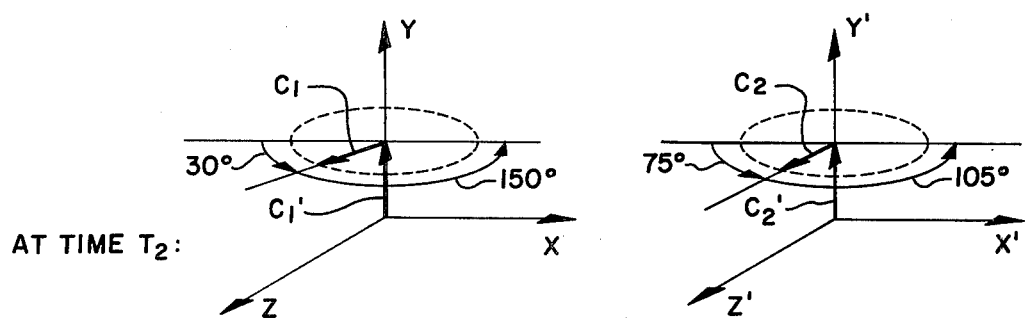
Figure 6:
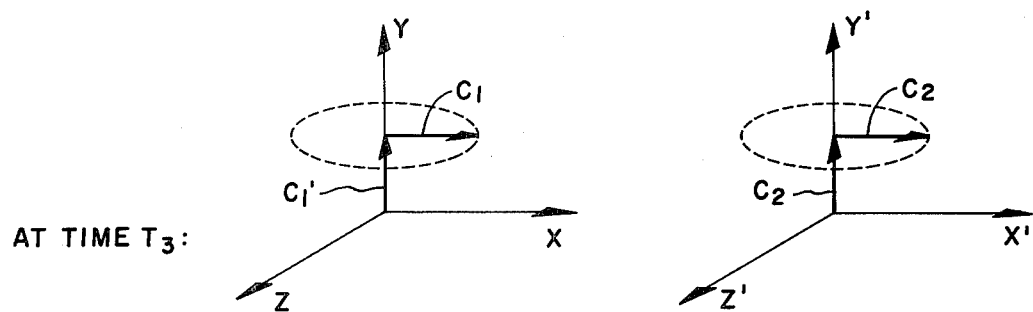

In FIGS. 4–6, the dipole components $C_1$ and $C_2$ are denoted by solid arrows and the broken circles in planes parallel to the X-Z and X'-Z' planes represent the locus of the tip of moments $D_1$ and $D_2$ (or $C_1$ and $C_2$). While initially (i.e. at the end of the pulse at time $t_1$) the pseudo-dipole components $C_1$ and $C_2$ are aligned in the direction of the X and X' axes, various effects within the echo medium cause the molecular pseudo-dipole moments to precess at different rates. Consequently, at a time $t_a$ following time $t_1$, the components $C_1$ and $C_2$ may be oriented (or dephased) as shown in FIG. 4. It will be understood that the de-phasing angles 150 degrees and 105 degrees shown in FIG. 4 are merely exemplary.

At time $t_2$ which is just after $t_a$, the photon source 20 directs a beam of photons characterized by one or more of the excitation frequencies onto the molecules represented by pseudo-dipole moments $D_1$ and $D_2$. This beam i adapted to precess the components $C_1$ and $C_2$ of the pseudo-dipole moments of those irradiated molecules substantially 180 degrees about an axis parallel to the Z and Z' axes, respectively, with the result that components $C_1$ and $C_2$ have the orientation shown in FIG. 5.

The differential rate of precession between the pseudo-dipoles represented by $C_1$ and $C_2$ accounts for the angular variation of those components in FIG. 4 and the corresponding variation just after the pulse at time $t_2$. Generally speaking, the effect which causes one of the pseudo-dipoles to precess faster than the other one is substantially constant over time so that the same differential orientation would occur for the two pseudo-dipoles over a period of duration $t_a$-$t_1$ on a repetitive basis. Consequently, since the rate of precession for the two pseudo-dipoles is substantially the same over time, the components $C_1$ and $C_2$ "catch up" to each other so that they become aligned in the same direction (or as shown in FIG. 6 at a time $t_a$-$t_1$ after the time $t_2$. When the pseudo-dipoles have their components $C_1$ and $C_2$ precisely aligned again, as shown in FIG. 6, they radiate at a characteristic frequency, i.e. produce photons representing a photon echo.

Generally, the excitation at time $t_1$ (denoted below as a $t_1$-operation) is considered to store (or write) information into the molecules in a cell, and the excitation at time $t_2$ (denoted below as a $t_2$-operation) is considered to provoke, or stimulate, a read-out of that stored information, with the read-out being in the form of the emission of photons by the in-phase pseudo-dipoles at time $t_3$. The detection of this emission is termed a detection operation below. The pseudo-dipoles $D_1$ and $D_2$ return to their ground states (as in FIG. 2) following their emission at time $t_3$.

In the illustrated example in FIGS. 2-7, the $t_1$-operation is adapted to rotate the pseudo-dipoles $D_1$ and $D_2$ by an arbitrary angle A, which may be greater or less than 90 degrees, but which as shown, is less than 90 degrees. Optimally, for this embodiment, the excitation at time $t_1$ is adjusted so that the excitation produces a 90 degree (modulo 180 degree) rotation in the orientation of the pseudo-dipole moments. Similarly, the $t_2$ operation produces a precession of $C_1$ and $C_2$ of E. In the optimal case E equals 180 degrees (modulo 360 degree), although other angular values are permitted.

Figure 7:
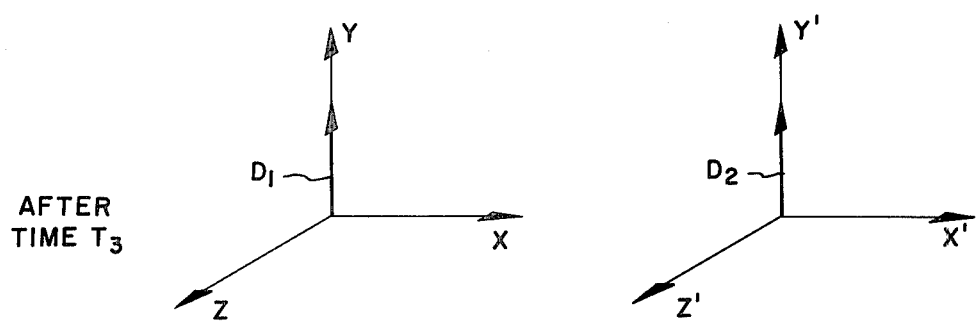

As illustrated in FIGS. 2-7, the $t_2$-operation provides the optimal 180 degree (modulo 360 degrees) rotation of the components $C_1$ and $C_2$ in a single step. Alternately, the step of rotation of the pseudo-dipoles by the optimal 180 degrees (modulo 360 degrees) (or the sub-optimum angle used) may be performed formed in a sequence of sub-steps. For example, the photon source 20 may be considered to provide a precession of the pseudo-dipoles at time $t'_2$ (after $t_a$) by an angle B, where B is less than E. The photon source 20 may then be considered to provide at a time $t_2$ (which is after time $t'_2$) a precession of those pseudo-dipole moments by an angle E-B. In the preferred form of the invention, B equals 90 degrees (modulo 180 degrees), although other values for B might be used. In the preferred form, with B equal to 90 degrees (modulo 180 degrees), the pseudo-dipoles $D_1$ and $D_2$ are both in parallel planes, i.e. the Y-Z and Y'-Z' planes immediately after the rotation at $t'_2$. Then at a subsequent time $t_2$, the photon source 20 provides a second 90 degree (modulo 180 degrees) rotation of the pseudo-dipole moments to establish a configuration substantially as shown in FIG. 5. Thereafter, operation continues as shown in FIGS. 6 and 7, as explained above. In this latter two-step imposition of an E rotation of the pseudo-dipole moments, it should be noted that the interval $t_a$-$t_1$ may be relatively short, for example, on the order of 100 picoseconds, while the time between time $t_a$ and $t_2$ may be relatively long, for example, on the order of minutes. The output photon echo is generated at an interval $t_a$-$t_1$ after the time $t_2$, and, in this case where the E rotation is accomplished in two steps, is termed a stimulated photon echo. In this form of the invention also, the angle E is optimally 180 degrees (modulo 360 degrees), although other angular values are permitted.

While the above operation is described in terms of a precessing pseudo-dipole model, it will be understood that this model provides a relatively simple description of the behavior of the echo medium 12. Alternatively, the description may be expressed in terms of a rigorous quantum mechanical analysis, utilizing for example density matrix techniques for accommodating the statistical nature of the many-body problem.

In the preferred form of the invention, the detector 16 provides a relatively high signal-to-noise ratio by being operative only during a time window displaced from $t_2$ by an interval approximately $t_2$-$t_1$ for the single step E rotation embodiment, and by a time window offset from $t_2$ by approximately $t'_2$-$t_1$ for the two-step E rotation configuration.

In order to provide an effective memory system, it will be understood that the controller 26 cyclically controls the operation of the system. For example, for the case of the stimulated photon echo, controller 26 is operative for one or more cells during each cycle to initiate one or more of the following operations in succession:

(a) A $t_2$-operation by the photon source 20 (i.e. irradiation of molecules in the cell to rotate the pseudo-dipole moments by an angle E-B), (b) A detection operation by detector 16 (i.e. detection of light at one or more of the characteristic frequencies), (c) A $t_1$-operation by the photon source 20 (i.e. irradiation of ground state molecules in a cell to rotate their pseudo-dipole moments by an angle A), (d) A $t'_2$-operation by photon source 20 (i.e. irradiation of molecules in the cell to rotate their pseudo-dipole moments by an angle B).

In one form of the invention, the controller may control the following succession of operations:
1. Operations (a) and (b) in succession to extract data from the cell followed by either:
2. Operations (c) and (d) in succession to store data representative of a first binary state in a cell; or 3. No additional operation to store data representative of the other binary state in the cell.

Alternatively, the controller may control the following succession of operations to randomly access cells in the memory system:
1. Operations (a), (b), (c) and (d) to non-destructively extract data from the cell when the extracted data is representative of a first binary state in the cell.
2. Operations (a) and (b) to non-destructively extract data when the extracted data is representative of the other binary state in the cell.
3. Operations (a), (c) and (d) to store data representative of the first binary state in the cell.
4. Operation (a) to store data representative of the other binary state in the cell.

Generally speaking, when the detector 16 detects a photon echo signal from a memory cell, that signal signifies that a first binary state (e.g. binary one) and had been stored in that cell. Consequently, upon detection of a stored first binary state in a cell, controller 26 then directs the photon source 20 to double-pulse (the $t_1$- and $t'_2$- operations) to re-write that information into that cell, thereby providing non-destructive read-out. When no photon echo signal is detected in the detection window, that signifies that a second binary state (e.g. binary zero) had been stored in that cell. No refresh is necessary in this case.

With the above configuration, the refresh period may be minutes long, while maintaining subnanosecond read/write times.

In one form of the invention, a $10^{15}$ bit memory may be provided with the echo medium 12 having dimensions of one cubic micron per bit for a memory volume of $10^3$ cubic centimeters, or a cube approximately four inches on a side. By way of example, the echo medium may be a cryogenic photon echo medium. For example, the medium 12 may be a liquid helium cooled praseodymium-doped lanthanum trifluoride ($Pr^{3+}$:$LaF_3$) crystal, readily excited by a dye-laser. Alternatively, the echo medium may be cesium vapor. The latter medium has a quantum transition at 8521 angstroms, which is compatible with readily available laser and detector diodes. In this form, the cesium vapor is maintained in a temperature range of 100–200 degrees centigrade to provide an appropriate vapor density.

In order to produce an echo in such exemplary systems, a selected cell must be irradiated by a pulse sequence determined by the particular embodiment. To address the various cells in the echo medium, the laser pulses from source 20 are selectively directable to cells in the X-Y plane as well as cells along the Z axis.

Figure 8:
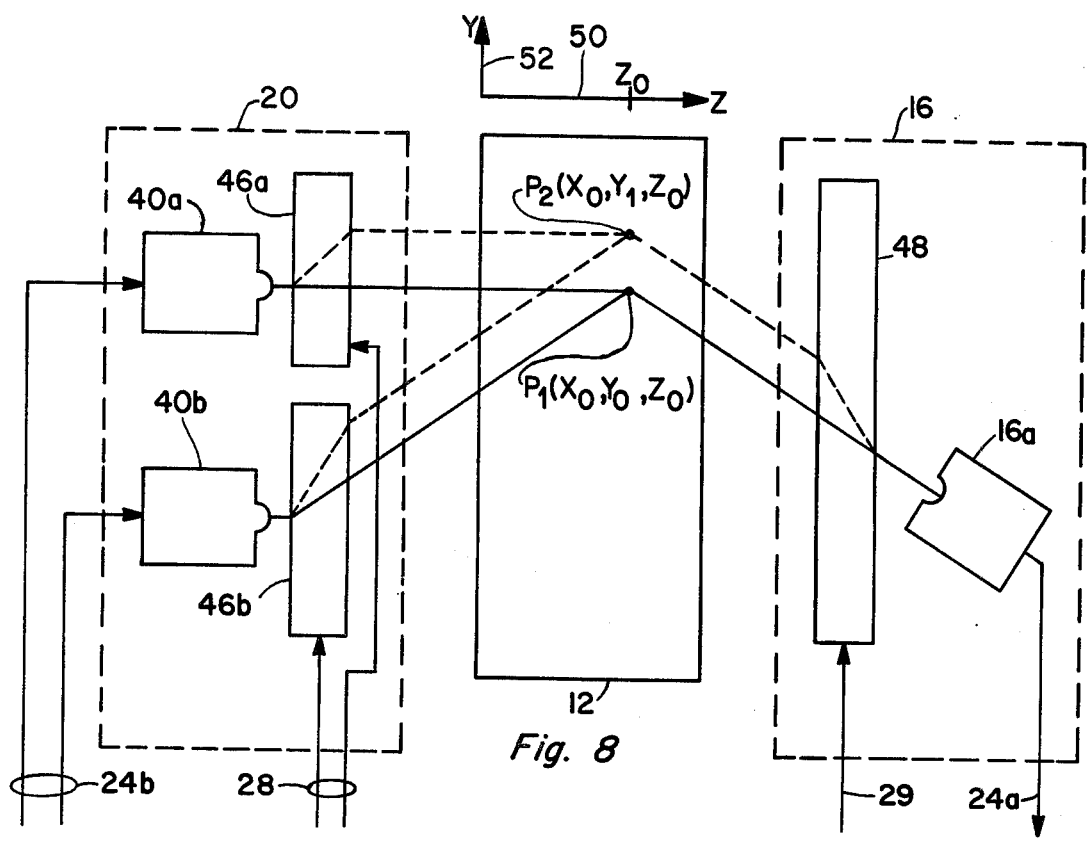
FIGS. 8 and 9 show, in block diagram form, the X-Y plane and Z-axis addressing portions of the system of FIG. 1.
Figure 9:
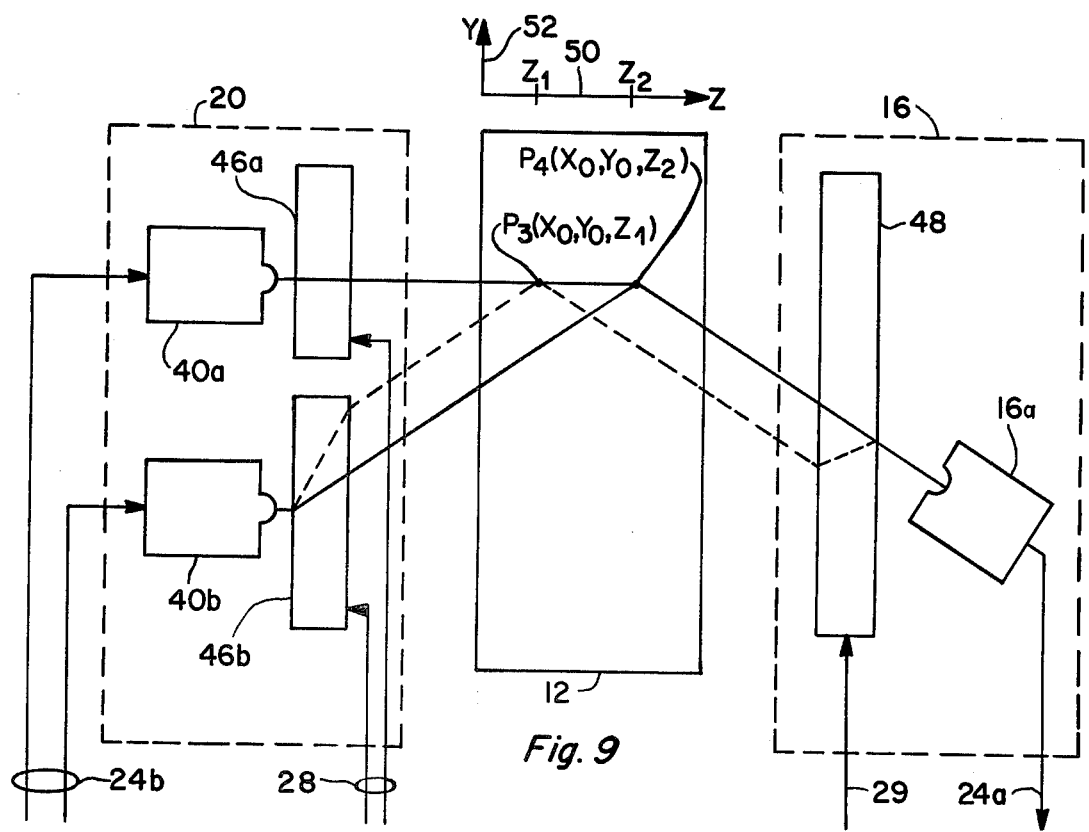

FIGS. 8 and 9 illustrate a preferred form for providing XY plane addressing and Z axis addressing, respectively. In those figures, the source 20 is shown to include two lasers denoted 40a and 40b, respectively, and associated input beam deflectors 46a and 46b. The detector 16 includes a detector element 16a and an output beam deflector 48. The beam deflectors 46a, 46b and 48 may be optical, electro-optical or acousto-optical devices which serve in an operative state to deflect the beam (as indicated in FIGS. 8 and 9, from the solid line to the broken line). Other forms of controllable beam deflectors may also be used. In FIG. 8, the echo medium 12 is shown with respect to a Z axis 50 which is perpendicular to X and Y axes. FIG. 8 illustrates addressing along the Y (vertical, as shown) axis 52. Addressing along the X axis (not shown) is similar. Two cells $P_1$ and $P_2$ in an X-Y plane (i.e. at coordinates $X_o, Z_o$) may be addressed by the lasers 40a and 40b in the following manner. Input beam deflector 46a may first provide "zero" deflection (as shown) in the Y direction for the beams from the lasers 40a and 40b so that they intersect at cell $P_1$ at point $(X_o, Y_o, Z_o)$. The detector element 16a (and deflector 48) is aligned with cell $P_1$ to receive radiation from that cell. In order to address cell $P_2$, the deflectors 46a, 46b and 48 are controlled to provide deflections of the beam path as indicated by the broken lines so that the beams from lasers 40a and 40b coincide at cell $P_1$ at point $(X_o, Y_1, Z_o)$ and light emitted from cell $P_2$ is directed appropriately by way of deflector 48 to the detector element 16a.

FIG. 9 shows a similar configuration for a cell $P_3$ at point $(X_o, Y_o, Z_1)$ and a cell $P_4$ at point $(X_o, Y_o, Z_2)$ which are displaced along the Z axis 50. These cells are addressed by controller 26 by controlling the beam deflectors 46a, 46b and 48 to appropriately control the beam path of the beam from lasers 40a and 40b and the output radiation from cells $P_3$ and $P_4$.

Using these techniques, addressing can be accomplished by translating one or both of the beams so that the beams overlap at differing depths, and/or at different locations at a given depth, in the echo medium 12, thereby selecting different layers, and locations within a layer, of the medium for echo production. Accordingly, each overlap region may be considered to be a cell.

These are several techniques for pulsing the echo medium 12 to obtain medium excitation. These include pulsing the intensity, frequency, or phase of the optical sources, as well as pulsing the photon echo medium itself to bring it into resonance. An example of the latter is Stark pulsing.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

We claim:
1. An information storage system, comprising:
A. echo medium including a plurality of cells, each of said cells including one or more molecules having at least one excited state and a ground state, said excited state being excitable by one or more incident photons characterized by one or more of a plurality of predetermined frequencies,
B. selectively operable excitation means for generating pulses of photons characterized by one or more of said predetermined frequencies,
C. addressing means for selectively directing said photon pulses onto one or more of the molecules of selected ones of said cells,
D. detection means for detecting photons emitted by one or more of the molecules of said selected cells, and
E. controller for operating said excitation means and said addressing means to selectively store data in and extract data from said selected cells, said controller including means for controlling said excitation means to generate a predetermined succession of said photon pulses for a cell selected by said addressing means whereby at least one molecule may first be excited and subsequently generate an echo comprising at least one emitted photon.

2. A system according to claim 1 wherein said predetermined succession includes photon pulses having predetermined photon densities and widths, spectral content, and inter-pulse separations whereby said molecules generate photon echoes.

3. A system according to claim 1 wherein said predetermined succession includes photon pulses having predetermined photon densities and widths, spectral content, and inter-pulse separations whereby said molecules generate Raman echoes.

4. A system according to claim 1 wherein said predetermined succession includes photon pulses having predetermined photon densities and widths, spectral content, and inter-pulse separations whereby said molecules generate tri-level echoes.

5. A system according to claim 1 wherein said predetermined succession includes photon pulses having predetermined photon densities and widths, spectral content, and inter-pulse separations whereby said molecules generate multiple echoes.

6. A system according to claim 5 wherein at least two of said emitted photons have different characteristic frequencies.

7. A system according to claim 5 wherein said emitted photons have the same characteristic frequencies.

8. A system according to claim 1 wherein said predetermined succession includes photon pulses having predetermined photon densities and widths, spectral content, and inter-pulse separations whereby said molecules generate multi-photon echoes.

9. A system according to claim 1 wherein said predetermined succession includes photon pulses having predetermined photon densities and widths, spectral content, and inter-pulse separations whereby said molecules generate stimulated photon echoes.

10. A system according to claim 1 wherein said predetermined succession includes photon pulses having predetermined photon densities and widths, spectral content, and inter-pulse separations whereby said molecules generate stimulated Raman echoes.

11. A system according to claim 1 wherein said predetermined succession includes photon pulses having predetermined photon densities and widths, spectral content, and inter-pulse separations whereby said molecules generate stimulated tri-level echoes.

12. A system according to claim 1 wherein said predetermined succession includes photon pulses having predetermined photon densities and widths, spectral content, and inter-pulse separations whereby said molecules generate stimulated multiple echoes.

13. A system according to claim 12 wherein at least two of said emitted photons have different characteristic frequencies.

14. A system according to claim 12 wherein said emitted photons have the same characteristic frequencies.

15. A system according to claim 1 wherein said predetermined succession includes photon pulses having predetermined photon densities and widths, spectral content, and inter-pulse separations whereby said molecules generate stimulated multi-photon echoes.

16. A system according to claim 1 wherein said excitation means and said addressing means are responsive to applied signals representative of the identification of various ones of said cells, and representative of data to be stored in the respective ones of said various cells.

17. A system according to claim 16 wherein said control means is responsive to applied write signals to operate said excitation means and said addressing means to store said data in said cells, and is responsive to applied read signals to operate said excitation means and said addressing means to extract said stored data from said cells.

18. A system according to claim 1 wherein said data is digital.

19. A system according to claim 1 wherein said data is analog.

20. A system according to claim 1 wherein said echo medium is cesium vapor.

21. A system according to claim 1 wherein said echo medium is ruby.

22. A system according to claim 1 wherein said echo medium is praseodymium-doped lanthanum trifluoride.

23. A system according to claim 1 wherein said optical excitation means includes one or more lasers.

24. A system according to claim 23 including a beam steering means for optical excitation means.

25. A system according to claim 24 wherein said beam steering means is electro-optical.

26. A system according to claim 1 wherein said echo medium includes a two dimensional array of cells.

27. A system according to claim 1 wherein said echo medium includes a three dimensional array of cells.

28. A system according to claim 27 wherein said beam steering means is acousto-optical.

29. An information storage system comprising:
A. a photon echo medium including at least one cell having a plurality of molecules each of said molecules having a ground state and at least one excited state excitable by one or more photons characterized by one or more predetermined frequencies, each of said molecules being characterized by a pseudo-dipole moment,
  aligned in the direction of a first reference axis, when said molecule is in its ground state, and
  having a processing component in a plane perpendicular to said first reference axis when said molecule is in a linear superposition of its ground state and an excited state,
wherein said pseudo-dipole moment is rotatable about an axis parallel to a second reference axis in response to one or more incident photon characterized by one or more of said predetermined frequencies, said second reference axis being perpendicular to said first reference axis,
B. a first optical excitation means for selectively directing photons characterized by one or more of said predetermined frequencies onto one of said cells having said plurality of molecules in said ground state, whereby the pseudo-dipole moments of those irradiated molecules are rotated by a first angle A about said second reference axis, and said irradiated molecules enter a first linear superposition of their ground state and one or more of their excited states,
C. a second optical excitation means for selectively directing photons characterized by one or more of said predetermined frequencies onto one of said cells having said plurality of molecules characterized by said first superposition of said ground and excited states, whereby the pseudo-dipole moments of those irradiated molecules are rotated by a second angle E about said second reference axis, and said irradiated molecules enter a second linear superposition of their ground state and one or more of their excited states, said second optical excitation means being selectively operable after said first optical excitation means, D. optical detection means for detecting photons emitted by molecules in said second superposition of said ground and excited states when the components of the pseudo-dipole moments of those molecules in said plane are substantially parallel, and E. a controller including means for selectively operating said first and second optical excitation means whereby to selectively store and extract information from selected ones of said cells.

30. A system according to claim 29 wherein A=90 degrees (modulo 180 degrees) and E=180 degrees (modulo 360 degrees).

31. A system according to claim 29 wherein said first optical excitation means is operative at a time $t_1$ to rotate the pseudo-dipole moments of said ground state molecules by A, and said second optical excitation means is operative at a time $t_2$ to rotate the pseudo-dipole moments of ones of said molecules in said first superposition of states by E in one step.

32. A system according to claim 31 wherein said detection means is operative in a time window offset from $t_2$ by substantially $t_2-t_1$.

33. A system according to claim 32 wherein A=90 degrees (modulo 180 degrees) and E=180 degrees (modulo 360 degrees).

34. A system according to claim 31 wherein A=90 degrees (modulo 180 degrees) and E=180 degrees (modulo 360 degrees).

35. A system according to claim 29 wherein said first optical excitation means is operative at a time $t_1$ to rotate the pseudo-dipole moments of said irradiated molecules by A, and said second optical excitation means is operative at a time $t'_2$ to rotate the pseudo-dipole moments of said molecules in said first superposition of states by an angle B, said dipoles being in an intermediate linear superposition of said ground state and one or more of said excited states, and operative at a time $t_2$ to rotate the pseudo-dipole moments of said molecules in said intermediate superposition of states by an angle E-B degrees.

36. A system according to claim 35 wherein A and B and E-B are substantially equal to 90 degrees (modulo 180 degrees).

37. A system according to claim 36 wherein said detection means is operative in a time window offset from $t_2$ by substantially $t'_2-t_1$.

38. A system according to claim 36 wherein said controller cyclically controls the operation of said system and includes means operative for each cell during each cycle for initiating one or more of the following operations in succession:

(a) a $t_2$-operation by said second optical excitation means whereby the pseudo-dipole moments of said molecules in said intermediate superposition of states are rotated by an angle E-B degrees, (b) a detection operation by said detection means whereby photons emitted by molecules in said second superposition of said ground and excited states when the components of the pseudo-dipole moments of those molecules in said plane are substantially parallel are detected, (c) a $t_1$-operation by said first optical excitation means whereby the pseudo-dipole moments of said irradiated molecules are rotated by A, (d) a $t'_2$-operation by said second optical excitation means whereby the pseudo-dipole moments of said molecules in said first superposition of states are rotated by an angle B, said dipoles being in an intermediate superposition of said ground state and one or more of said excited states, wherein each cycle includes for each cell:
 operations (a) and (b) in succession to extract data from said cell, followed by:
  i. operations (c) and (d) in succession to store data representative of a first binary state in said cell, or
  ii. no additional operation to store data representative of the other binary state in said cell.

39. A system according to claim 36 wherein said controller controls the random access of cells of said system, and includes means operative for each cell for initiating one or more of the following operations in succession:

(a) a $t_2$-operation by said second optical excitation means whereby the pseudo-dipole moments of said molecules in said intermediate superposition of states are rotated by an angle E-B degrees, (b) a detection operation by said detection means whereby photons emitted by molecules in said second superposition of said ground and excited states when the components of the pseudo-dipole moments of those molecules in said plane are substantially parallel are detected, (c) a $t_1$-operation by said first optical excitation means whereby the pseudo-dipole moments of said irradiated molecules are rotated by A, (d) a $t'_2$-operation by said second optical excitation means whereby the pseudo-dipole moments of said molecules in said first superposition of states are rotated by an angle B, said dipoles being in an intermediate superposition of said ground state and one or more of said excited states wherein each random access includes for each cell one of the successions:
 operations (a), (b), (c) and (d) to extract data from said cell when said extracted data is representative of a first binary state in said cell,
 operations (a) and (b) to extract data when said extracted data is representative of the other binary state in said cell,
 operations (a), (c) and (d) to store data representative of said first binary state in said cell, and
 operation (a) to store data representative of said other binary state in said cell.

40. A system according to claim 35 wherein said detection means is operative in a time window offset from $t_2$ by substantially $t'_2-t_1$.

41. A system according to claim 35 wherein said controller cyclically controls the operation of said system and includes means operative for each cell during each cycle for initiating one or more of the following operations in succession:

(a) a $t_2$-operation by said second optical excitation means whereby the pseudo-dipole moments of said molecules in said intermediate superposition of states are rotated by an angle E-B degrees, (b) a detection operation by said detection means whereby photons emitted by molecules in said second superposition of said ground and excited states when the components of the pseudo-dipole moments of those molecules in said plane are substantially parallel are detected, (c) a t1-operation by said first optical excitation means whereby the pseudo-dipole moments of said irradiated molecules are rotated by A, (d) a t'2-operation by said second optical excitation means whereby the pseudodipole moments of said molecules in said first superposition of states are rotated by an angle B, said dipoles being in an intermediate superposition of said ground state and one or more of said excited states, wherein each cycle includes for each cell:
operations (a) and (b) in succession to extract data from said cell, followed by:
i. operations (c) and (d) in succession to store data representative of a first binary state in said cell, or
ii. no additional operation to store data representative of the other binary state in said cell.

42. A system according to claim 35 wherein said controller controls the random access of cells of said system, and includes means operative for each cell for initiating one or more of the following operations in succession:

(a) a $t_2$-operation by said second optical excitation means whereby the pseudo-dipole moments of said molecules in said intermediate superposition of states are rotated by an angle E-B degrees, (b) a detection operation by said detection means whereby photons emitted by molecules in said second superposition of said ground and excited states when the components of the pseudo-dipole moments of those molecules in said plane are substantially parallel are detected, (c) a $t_1$-operation by said first optical excitation means whereby the pseudo-dipole moments of said irradiated molecules are rotated by A, (d) a t'2-operation by said second optical excitation means whereby the pseudo-dipole moments of said molecules in said first superposition of states are rotated by an angle B, said dipoles being in an intermediate superposition of said ground state and one or more of said excited states wherein each random access includes for each cell one of the successions:
operations (a), (b), (c) and (d) to extract data from said cell when said extracted data is representative of a first binary state in said cell,
operations (a) and (b) to extract data when said extracted data is representative of the other binary state in said cell,
operations (a), (c) and (d) to store data representative of said first binary state in said cell, and
operation (a) to store data representative of said other binary state in said cell.

43. A system according to claim 29 wherein said echo medium is cesium vapor.

44. A system according to claim 29 wherein said echo medium is ruby.

45. A system according to claim 29 wherein said echo medium is praseodymium-doped lanthanum trifluoride.

46. A system according to claim 29 wherein said first and second optical excitation means are lasers.

47. A system according to claim 46 including a beam steering means for first and second optical excitation means.

48. A system according to claim 47 wherein said beam steering means are independently controllable by said controller.

49. A system according to claim 47 wherein said beam steering means is electro-optical.

50. A system according to claim 47 wherein said beam steering means is acousto-optical.

51. A system according to claim 29 wherein said echo medium includes a two dimensional array of cells.

52. A system according to claim 29 wherein said echo medium includes a three dimensional array of cells.

* * * * *